United States Patent
Noguchi et al.

(10) Patent No.: US 8,587,460 B2
(45) Date of Patent: Nov. 19, 2013

(54) A/D CONVERSION DEVICE AND COMPENSATION CONTROL METHOD FOR A/D CONVERSION DEVICE

(75) Inventors: Hidemi Noguchi, Tokyo (JP); Yasushi Amamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/514,775

(22) PCT Filed: Dec. 10, 2010

(86) PCT No.: PCT/JP2010/072214
§ 371 (c)(1),
(2), (4) Date: Jun. 8, 2012

(87) PCT Pub. No.: WO2011/071142
PCT Pub. Date: Jun. 16, 2011

(65) Prior Publication Data
US 2012/0242520 A1  Sep. 27, 2012

(30) Foreign Application Priority Data
Dec. 11, 2009  (JP) .................................. 2009-281887

(51) Int. Cl.
*H03M 1/06* (2006.01)

(52) U.S. Cl.
USPC ........... 341/118; 341/120; 341/130; 341/138; 341/155; 327/311; 327/316; 327/382; 327/390; 348/678; 348/725; 348/E5.096; 348/E5.115

(58) Field of Classification Search
USPC .......... 341/118–155; 327/311, 316, 382, 390; 348/678, 725, E5.096, E5.115
See application file for complete search history.

(56) References Cited

U.S. PATENT DOCUMENTS

| | | | | | |
|---|---|---|---|---|---|
| 6,069,577 | A | * | 5/2000 | Morisson et al. | 341/120 |
| 6,433,712 | B1 | * | 8/2002 | Ohnhaeuser et al. | 341/118 |
| 7,081,214 | B2 | * | 7/2006 | Matsuba et al. | 252/512 |
| 7,161,514 | B2 | | 1/2007 | Tamba | |
| 7,176,822 | B2 | * | 2/2007 | Schimper | 341/120 |
| 7,336,729 | B2 | * | 2/2008 | Agazzi | 341/118 |
| 7,352,316 | B2 | | 4/2008 | Hori et al. | |

(Continued)

FOREIGN PATENT DOCUMENTS

| | | |
|---|---|---|
| JP | 2001-308804 A | 11/2001 |
| JP | 2003-133954 A | 5/2003 |
| JP | 2007-150640 A | 6/2007 |
| JP | 2009-130444 A | 6/2009 |

OTHER PUBLICATIONS

International Search Report in PCT/JP2010/072214 dated Jan. 11, 2011(English Translation Thereof).

*Primary Examiner* — Lam T Mai
(74) *Attorney, Agent, or Firm* — McGinn IP Law Group, PLLC

(57) ABSTRACT

An A/D conversion apparatus includes first to M-th ADC connected in parallel converting an analog input signal to digital signals in response to M-phase sampling signals, a reference A/D conversion circuit that converts the analog input signal to a digital signal in response to a divided-by-(n× M+1) sampling signal; and a control unit that compares, for each period of (n×M+1) clock cycles, one of the digital signals from a corresponding one of first to M-th ADC with the digital signal from the reference ADC in a predetermined order of the first to M-th ADC, and generates a compensation control signal based on the comparison result for supply to the corresponding ADC.

14 Claims, 8 Drawing Sheets

(56) References Cited

U.S. PATENT DOCUMENTS

| | | | |
|---|---|---|---|
| 7,629,906 B2 * | 12/2009 | Juang et al. | 341/118 |
| 8,325,072 B2 * | 12/2012 | Kuttner | 341/120 |
| 8,446,304 B2 * | 5/2013 | Scanlan | 341/120 |
| 2001/0052864 A1 | 12/2001 | Shimizu et al. | |
| 2003/0080885 A1 | 5/2003 | Tamba | |
| 2007/0120724 A1 | 5/2007 | Hori et al. | |
| 2009/0131010 A1 | 5/2009 | Oshima et al. | |
| 2013/0027234 A1 * | 1/2013 | Yoshida et al. | 341/118 |

* cited by examiner

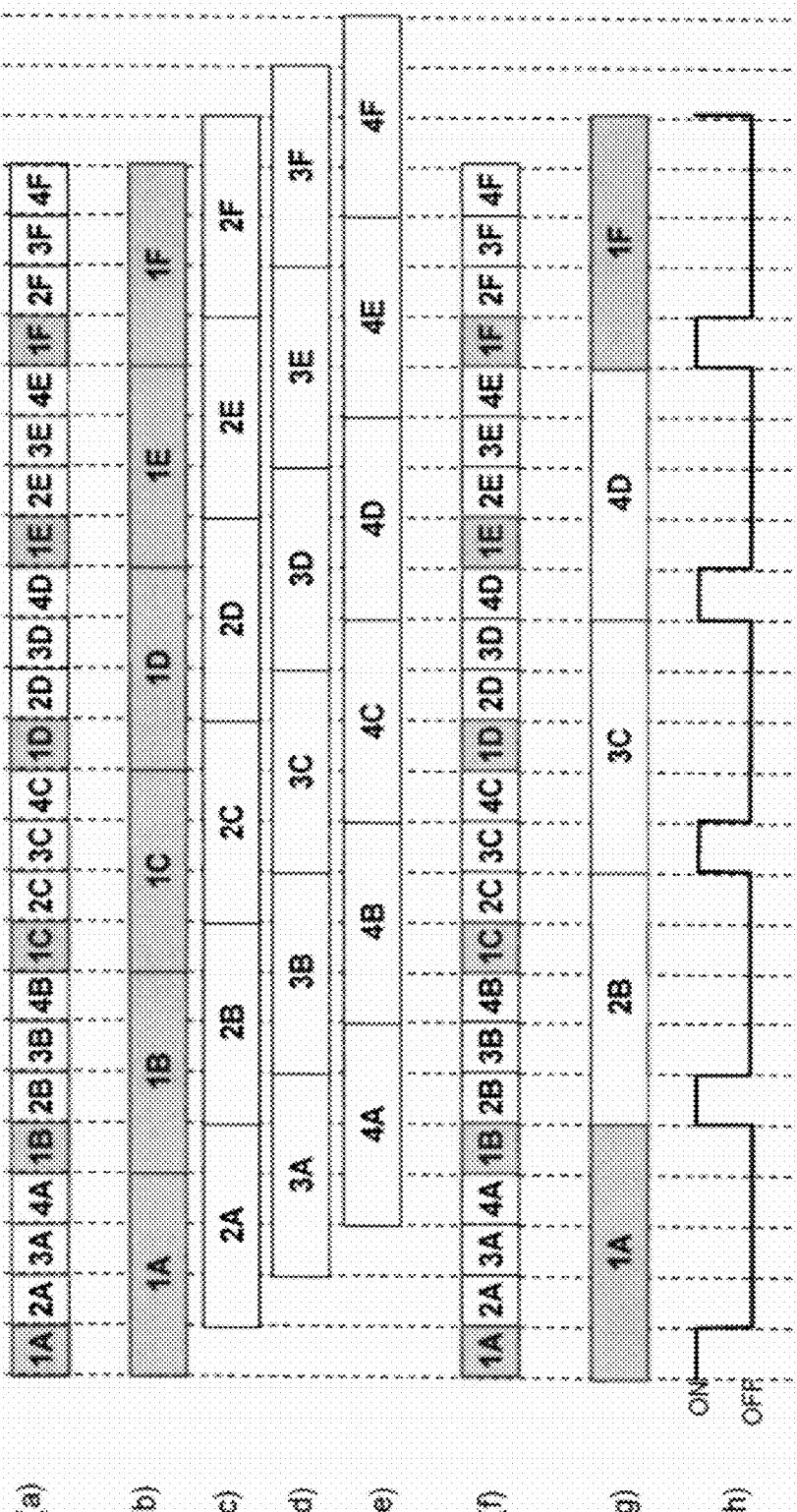

A/D CONVERSION DEVICE AND COMPENSATION CONTROL METHOD FOR A/D CONVERSION DEVICE

TECHNICAL FIELD

Related Application

The present invention is based upon and claims the benefit of the priority of Japanese Patent Application No. 2009-2818877 (filed on Dec. 11, 2009), the disclosure of which is incorporated herein in its entirety by reference.

The present invention relates to an A/D conversion apparatus that converts an analog signal to a digital signal. More specifically, the invention relates to an A/D conversion apparatus of a time-interleaved system where a plurality of A/D conversion circuits are operated in parallel to perform analog-to-digital conversion, and a compensation control method for the A/D conversion apparatus.

BACKGROUND

Recently, a digital technology has remarkably developed and a demand for a higher-speed operation and a higher accuracy of an A/D conversion apparatus that converts an analog signal to a digital signal has more and more increased. As one technology for implementing a higher-speed operation of the A/D conversion apparatus, the A/D conversion apparatus of a time-interleaved system is employed. In this system, a plurality of A/D conversion circuits (also referred to as "sub-A/D conversion circuits") are cyclically operated in a predetermined order to achieve equivalently high-speed sampling by an entirety of the plurality of sub-A/D conversion circuits. Assume that the number of the sub-A/D conversion circuits connected in parallel is M. Then, by causing the sub-A/D conversion circuits to respectively perform A/D conversion operations at a sampling frequency of fs/M [Hz] at timings (phases) each shifted just by 1/(fs) [sec], an A/D conversion operation equivalent to a conversion process at a sampling frequency of fs [Hz] can be effectively implemented. That is, an increase in speed of the operation to (M) times the sampling frequency (fs/M [Hz]) of the individual sub-A/D conversion circuit) (M being the number of the sub-A/D conversion circuits connected in parallel) can be implemented.

In the A/D conversion apparatus that performs the process by the sub-A/D conversion circuits, however, error components (variations) such a gain (gain), an offset, and a frequency characteristic among the sub-A/D conversion circuits may increase noise and distortion, and therefore may deteriorate a conversion accuracy of the A/D conversion apparatus as a whole. For this reason, it becomes important to perform calibration for making characteristics uniform among low-speed sub-A/D conversion circuits connected in parallel. In this calibration, compensation is applied to each sub-A/D conversion circuit to make characteristics uniform among the sub-A/D conversion circuits uniform.

As means for calibrating gain (gain) and offset error components among sub-A/D conversion circuits, a reference may be done to description of Patent Document 1, for example. In this calibration method, a sine wave is generated as a training anal for calibration. Then, using the signal of the sine wave, sine curve fitting (fitting the converted waveform data to the sine wave) is performed on a sequence of the converted data for each of a plurality of A/D conversion means (corresponding to each of the sub-A/D conversion circuits) to determine a calibration value for each of the gain, the offset, and a skew. The calibration value is stored in a calibration memory. Then, when normal A/D conversion is performed, data is calibrated in accordance with the calibration value stored in the calibration memory. Alternatively, hardware (such as a DA converter) for gain calibration and offset calibration is provided for each A/D conversion means (circuit), and the calculation values of the gain and the offset from the calibration memory are set in the hardware for the calibrations of the A/D conversion circuit.

As a configuration of a time-interleaved A/D conversion apparatus for deriving a compensation control signal by adaptive processing using a teaching signal (teacher signal) to compensate a DC offset, a conversion gain error, and the like of each A/D converter (corresponding to each sub-A/D conversion circuit), a reference may be made to description of Patent Document 2, for example. Patent Document 2 discloses a configuration where in addition to A/D converters (low-speed high-resolution A/D converters) that perform time-interleaved operation, a high-speed low-resolution A/D converter that operates at a rate same as an equivalent sampling rate obtained by time interleaving is included. An output of the high-speed low-resolution A/D converter is set to the teaching signal that provides basis for conversion of a conversion error. The compensation control signal is calculated by the adaptive signal processing, and an output value of each of the circuits for A/D conversion connected in parallel that perform the time-interleaved operation is compensated.

That is, this configuration includes M first A/D converters ADC 0 to ADC (M−1) (low-speed high-resolution A/D converters) having a sampling rate of FS [Hz] and a resolution of K1 [bit] and a second A/D converter ADC (M) (high-speed low-resolution A/D converter) having a sampling rate of M×FS [Hz] and a resolution of K2<K1 [bit]. The first A/D converters ADC 0 to ADC (M−1) are connected in common to an analog input terminal, and respectively perform A/D conversions in response to M-phase clock signals CLK 0 to CLK (M−1) each delayed in timing (phase) by 1/FS/M [sec]. Then, obtained digital signals SIG 0 to SIG (M−1) are cyclically multiplexed in synchronization with clocks of M×FS [Hz] to obtain a digital signal x[n] having a sampling rate of M×FS [Hz] and a resolution of K1 [bit]. An output signal y[n] is generated by FIR (Finite Impulse Response) linear filtering operation based on an inner product between a vector signal Xv[n] and a weight vector Wv[n] as follows:

$$y[n]=w(1)x[n]+w(2)x[n-1]+w(3)x[n-2]+\ldots+w(N)x[n-(N-1)] \quad (1)$$

where $Xv[n]=(x[n], x[n-1], \ldots x[n-1])^T$ (T indicating transpose), being composed of N signals obtained by delaying the digital signal x[n] by 0 to (N−1) samples, and the weight vector $Wv[n]=(w(1), \ldots w(N-1), w(N))^T$, being composed of N elements.

Alternatively, the output signal y[n] is obtained by nonlinear filtering operation described below, obtained by adding a constant term of w0·x0 to the FIR linear filtering operation:

$$y[n]=w0x0+w(1)x[n]+w(2)x[n-1]+\ldots+w(3)x[n-2]+\ldots+w(N)x[n-(N-1)] \quad (2)$$

Then, the second A/D converter ADC (M) and the first A/D converters ADC 0 to ADC (M−1) are connected in common to the input terminal to obtain an teaching signal d[n].

A residual signal between the output signal y[n] and the teaching signal d[n] as follows is generated:

$$e[n]=d[n]-y[n]$$

Then, the residual signal e[n] is multiplied by a gain vector Kv[n], and is then added to the current weight vector Wv[n] to be set to a weight vector Wv[n+M] after sampling of M samples:

$$Wv[n+M]=Wv[n]+Kv[n]\times e[n] \quad (3)$$

This gain vector Kv[n] is generated by an adaptive algorithm (RLS (Recursive Least Square) algorithm for example, as well as LMS (Least Mean Square) and so forth) that operates such that a square mean value of the residual signal e[n] is minimized, based on the vector signal Xv[n]. DC offsets, conversion gain errors, sampling timing errors, frequency characteristics and so forth of the first A/D converters ADC 0 to ADC (M−1) are compensated.

[Patent Document 1] JP Patent Kokai Publication No. JP-P2003-133954A

[Patent Document 2] JP Patent Kokai Publication No. JP-P2007-150640A

SUMMARY

Each of the entire disclosures of Patent Documents 1 and 2 listed above is incorporated herein by reference. Analyses of the related arts based on a result of study by the inventor of the present invention will be given below.

In the configuration disclosed in Patent Document or the like, the sine wave is generated as the training signal for calibration to perform the calibration. Accordingly, in order to cope with a case where a circuit characteristic changes according to a power supply variation, a use temperature change, an aging change, or the like, it is necessary to temporarily stop a normal A/D conversion process to provide a time interval during which the calibration is performed.

As described above, the A/D conversion apparatus that stops a normal A/D conversion operation to perform the calibration is not suited to an apparatus such as a communication apparatus for which accuracy needs to be continuously ensured. That is, in case the A/D conversion apparatus is used for the communication apparatus, it is necessary to implement means for adaptively performing calibration in a background, for example, without stopping an original A/D conversion operation.

In Patent Document 2, it is necessary to have the high-speed A/D conversion circuit (having a low resolution, however) that performs a conversion operation at a rate same as the equivalent sampling rate FS which is obtained by time interleaving. However, one of major reasons for adopting the time-interleaving system is that a desired high-speed operation cannot be implemented by a single A/D conversion circuit. Accordingly, it is often difficult to implement the high-speed A/D conversion circuit that performs the conversion operation at the rate same as the equivalent sampling rate FS obtained by time interleaving.

Alternatively, even if the high-speed A/D conversion circuit that operates at the rate same as the equivalent sampling rate obtained by time interleaving can be implemented, power consumption will remarkably increase in order to achieve a high-speed operation.

Accordingly, an object of the present invention is to provide an A/D conversion apparatus and a method that can accommodate a higher-speed operation and does not need to stop operation when calibration is performed.

In achieving the above-mentioned object, according to the present invention, there is provided an A/D conversion apparatus and a method that can suppress an increase in the circuit size and an increase in power consumption.

According to the present invention, there is provided an A/D conversion apparatus comprising:

first to M-th (M being a preset integer not less than two) A/D conversion circuits connected in parallel, the first to M-th A/D conversion circuits respectively converting an analog input signal to digital signals in response to M-phase sampling signals obtained by frequency-dividing a clock signal by M and equally spaced by one cycle of the clock signal;

a reference A/D conversion circuit that converts the analog input signal to a digital signal, in response to a sampling signal obtained by frequency-dividing the clock signal by (n×M+1) (n being a preset positive integer), analog inputs of the first to M-th A/D conversion circuits and the reference A/D conversion circuit being connected in common; and a control unit that compares, for each period of (n×M+1) cycles of the clock signal, one of the digital signals from a corresponding one of the first to M-th A/D conversion circuits with the digital signal from the reference A/D conversion circuit in a predetermined order of the first to M-th A/D conversion circuits, generates a compensation control signal based on a result of the comparison, and then supplies the compensation control signal to the corresponding one of the A/D conversion circuits.

According to the present invention, there is provided a compensation control method of an A/D conversion apparatus of an interleave system where first to M-th (M being a preset integer not less than two) A/D conversion circuits connected in parallel respectively convert an analog input signal to digital signals in response to M-phase sampling signals obtained by frequency-dividing a clock signal by M and equally spaced by one cycle of the clock signal, the method comprising:

providing a reference A/D conversion circuit having an analog input connected in common with analog inputs of the first to M-th (M being the preset positive integer) A/D conversion circuits;

the reference A/D conversion circuit converting the analog input signal to a digital signal, in response to a sampling signal obtained by frequency-dividing the clock signal by (n×M+1) (n being a preset positive integer); and a control unit comparing, for each period of (n×M+1) cycles of the clock signal, one of the digital signals from a corresponding one of the first to M-th A/D conversion circuits with the digital signal from the reference A/D conversion circuit in a predetermined order of the first to M-th A/D conversion circuits, generating a compensation control signal based on a result of the comparison, and supplying the compensation control signal to the corresponding one of the A/D conversion circuits.

According to the present invention, there can be provided an AD conversion apparatus and a method that accommodate a higher-speed operation and eliminate the need for stopping operation in order to perform calibration. Further, according to the present invention, calibration of the A/D conversion apparatus can be achieved during normal A/D conversion operation, while suppressing an increase in the circuit size and an increase in power consumption.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized the invention is ca able of other and different embodiments, and its several details are capable of modifications in various obvious respects, all without departing from the invention. Accordingly, the drawing and description are to be regarded as illustrative in nature, and not as restrictive.

Figure 1:
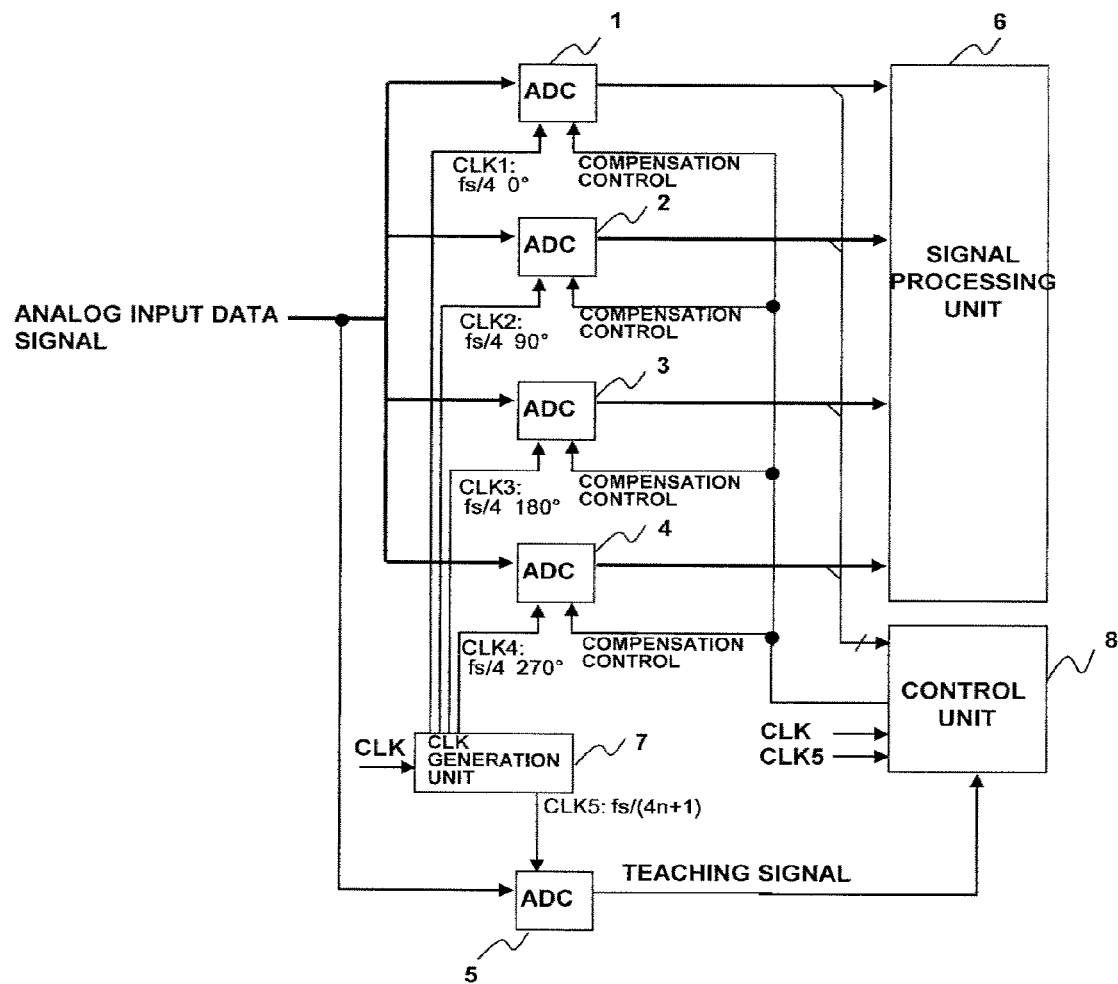
FIG. 1 is a diagram showing a configuration of an exemplary embodiment of the present invention.

(a) to (h) of FIG. 8 are a timing chart for explaining operation of the third exemplary embodiment of the present invention.

PREFERRED MODES

An A/D conversion apparatus according to one aspect of the present invention includes first to M-th (M being a preset integer not less than two) A/D conversion circuits (1 to 4 in FIG. 1, for example) connected in parallel and a reference A/D conversion circuit (5). The first to M-th A/D conversion circuits respectively convert an analog input signal to digital signals in response to M-phase sampling signals (CLK1 to CLK4 in FIG. 1 in case M is set to four, though no particular limitation is imposed) which are obtained by frequency-dividing a clock signal by M and are equally spaced by one cycle of the clock signal. The reference A/D conversion circuit (5) converts the analog input signal to a digital signal, in response to a sampling signal (CLK 5 in FIG. 1) which is obtained by frequency-dividing the clock signal by $(n \times M+1)$ (n being a preset positive integer). Analog inputs of the first to M-th A/D conversion circuits (1 to 4) and the reference A/D conversion circuit (5) are connected in common. The A/D conversion apparatus further includes a control unit (8) that compares, for each period of $(n \times M+1)$ cycles of the clock signal, one of the digital signals from a corresponding one of the first to M-th A/D conversion circuits (1 to 4) with the digital signal from the reference A/D conversion circuit (5) in a predetermined order of the first to M-th A/D conversion circuits (1 to 4), generates a compensation control signal based on a result of the comparison, and then supplies the compensation control signal to the corresponding one of the A/D conversion circuits (1 to 4). A reference numeral within a bracket just gives an example of association with the drawing of an exemplary embodiment, and should not of course be interpreted as limiting the present invention. The same holds true for the following description.

According to an aspect of the present invention, the control unit may include first to M-th control units (9 to 12 in FIG. 3) respectively corresponding to the first to M-th A/D conversion circuits (1 to 4). According to an aspect of the present invention, each of the first to M-th control units (9 to 12 in FIG. 3), for each period of the $(n \times M+1)$ cycles of the clock signal, compares the digital signal output from one of the first to M-th A/D conversion circuits (1 to 4) corresponding to the control unit with the digital signal output from the reference A/D conversion circuit (5) for each period of $M \times (n \times M+1)$ cycles of the clock signal.

According to an aspect of the present invention, the control unit (13 in FIG. 5) may receive the first to M-th digital signals respectively output from first to M-th A/D conversion circuits, in parallel.

According to an aspect of the present invention, a time interval during which the control unit is enabled to compare the digital signal output from each of the first to M-th A/D conversion circuits (1 to 4) with the digital signal output from the reference A/D conversion circuit (5) is set to M cycles of the clock signal at maximum.

According to an aspect of the present invention, the A/D conversion apparatus includes a multiplexer circuit (14 in FIG. 7) that cyclically switches, selects, and outputs each of first to M-th digital signals at one of timings separated by intervals each corresponding to one cycle of the clock signal, for each period of the clock signal, the first to M-th digital signals being respectively output from the first to M-th A/D conversion circuits for each period of M cycles of the clock signal. The control unit (15 in FIG. 7) may compare, for each period of $(n \times M+1)$ cycles of the clock signal, one of the digital signals cyclically and sequentially switched and then output from the multiplexer circuit (14 in FIG. 7) for each period of the clock signal (CLK) with the digital signal output from the reference A/D conversion circuit (5) for each period of $(n \times M+1)$ cycles of the clock signal, the comparison being performed in a predetermined numbered one (such as a first cycle) of $(n \times M+1)$ cycles of the clock signal.

According to an aspect of the present invention, the control unit generates the compensation control signal such that a difference between the digital signal output from each of the first to M-th A/D conversion circuits (1 to 4) and the digital signal output from the reference A/D conversion circuit is minimized.

A mode for carrying out the present invention will be described below. In the present invention, a reference A/D conversion circuit having performance equivalent or less than to that of each of a plurality of sub-A/D conversion circuits in terms of both of a resolution and a sampling rate is provided for an A/D conversion apparatus of a time-interleaved system where the A/D conversion circuits (sub-A/D conversion circuits) are cyclically operated for analog-to-digital conversions in a predetermined order to perform the conversions. Thus, when the A/D conversion apparatus calibrates characteristic variations among the sub-A/D conversion circuits, calibration of each sub-A/D conversion circuit can be implemented even at a time of system operation where each sub-A/D conversion circuit normally operates, for example.

In the present invention, when a sampling frequency of each of the A/D conversion circuits of the time-interleaved system is set to fs[Hz] and the number of interleaves (number of the sub-A/D conversion circuits connected in parallel) is set to M, the reference A/D conversion circuit having a sampling frequency (conversion frequency) of $fs/(n \times M+1)$ (n being a predetermined positive integer) is provided, and a control unit that outputs a compensation control signal based on a result of comparison between an output of this reference A/D conversion circuit and an output of each sub-A/D conversion circuit is provided. Then, compensation is applied to each sub-A/D conversion circuit (offset, gain, and the like of each sub-A/D conversion circuit are compensated by hardware such as a D/A conversion circuit), based on the compensation control signal (compensation coefficient) from the control unit. Alternatively, compensation is applied to an output (digital output signal) of each sub-A/D conversion circuit, based on the compensation control signal (compensation coefficient).

FIG. 1 is a diagram showing a configuration in an exemplary embodiment of the present invention. FIG. 1 shows a configuration of a time-interleaved A/D conversion apparatus. For simplification of description, FIG. 1 shows an example where the invention is applied to an A/D conversion apparatus with the number of interleaves (number of "sub-A/D conversion circuits" connected in parallel) M set to four to achieve a sampling frequency fs [Hz]. In the present invention, the number of sub-A/D conversion circuits connected in parallel (the number of interleaves) is not of course limited to four.

Referring to FIG. 1, the A/D conversion apparatus in this example comprises:

four sub-A/D conversion circuits (ADCc) 1 to 4 connected in parallel, with analog inputs thereof connected in common to an input terminal of an analog input data signal;

a digital signal processing unit 6 that processes outputs of the sub-A/D conversion circuits (ADCs) 1 to 4;

a reference A/D conversion circuit (ADC) 5;

a clock generation unit (CLK generation unit) 7 that respectively generates and supplies sampling clock signals CLK1 to CLK4 and CLK5 to the sub-A/D conversion circuits (ADCs) 1 to 4 and the reference A/D conversion circuit (ADC) 5; and a control unit (circuit) 8 that compares each of outputs of the sub-A/D conversion circuits (ADCs) 1 to 4 with an output of the reference A/D conversion circuit (ADC) 5 and outputs a compensation control signal (compensation coefficient) to each of the sub-A/D conversion circuits (ADCs) 1 to 4.

The four sub-A/D conversion circuits (ADCs) 1 to 4 connected in parallel have the same configuration, and respectively sample the analog input data signal in response to four-phase clock signals CLK1 to CLK4 having a frequency of fs/4 [Hz] and mutually shifted in timing just by $(1/4) \times (1/(fs/4))$ [sec] (accordingly by a phase of $(1/4) \times 360° = 90°$) to convert the sampled analog input data signal to digital signals. The sub-A/D conversion circuits (ADCs) 1 to 4 may be A/D conversion circuits of a flash (all-parallel) type in which a plurality of comparators are connected in parallel. Alternatively, the sub-A/D conversion circuits may be A/D conversion circuits of a sequential comparison type.

The analog input data signal is also supplied to the reference A/D conversion circuit (ADC) 5. The reference A/D conversion circuit (ADC) 5 samples (performs analog-to-digital conversion of) the analog input data signal in response to a clock signal CLK5 having a frequency of $fs/(4 \times n+1)$ [Hz] ($n=1, 2, 3, \ldots$). The reference A/D conversion circuit (ADC) 5 has a resolution equivalent or less than that of each of the sub-A/D conversion circuits (ADCs) 1 to 4.

The clock generation unit 7 generates the four-phase clocks CLK1 to CLK4 (having the frequency of fs/4 and being equally spaced by an interval of 1/fs [sec]) which are obtained by frequency-dividing a clock signal CLK having a frequency of fs. The clock generation unit 7 also generates the divided-by-five clock signal CLK 5 obtained by frequency-dividing the clock signal CLK by $(4 \times n+1)$. Though no particular limitation is imposed, the phase of a rising edge of the divided-by-five clock signal CLK5 is set to be the same as that of the clock signal CLK1.

The control unit 8 receives a digital signal output from the reference A/D conversion circuit (ADC) 5, for each period $(=(4 \times n+1)/fs)$, as an teaching signal, and compares this teaching signal with the output (having a period of 4/fs) of a corresponding one of the sub-A/D conversion circuits (ADCs) 1 to 4. Then, the control unit 8 performs adaptive control such that a difference between the two outputs of the reference A/D conversion circuit (ADC) 5 and the sub-A/D conversion circuit (ADC) to be compared is minimized, and supplies a compensation control signal to the corresponding one of the sub-A/D conversion circuits (ADCs) 1 to 4.

Input and comparison of the two output signals of the reference A/D conversion circuit (ADC) 5 and the corresponding one of the sub-A/D conversion circuits (ADCs), and generation and supply of the compensation control signal to the corresponding one of the sub-A/D conversion circuits (ADCs) based on a result of the comparison are performed within one period $(=(4 \times n+1)/fs)$ of the clock signal CLK5.

Each of the sub-A/D conversion circuits (ADCs) 1 to 4 performs at least one of DC offset adjustment, gain adjustment, and sampling phase adjustment, using the compensation control signal from the control unit 8. Each of the sub-A/D conversion circuits (ADCs) 1 to 4 may calibrate DC offset of the sub-A/D conversion circuit or a parameter (reference voltage at a full scale, for example) that defines a conversion gain between the analog input data signal and the output digital signal, by a D/A converter not shown, using the compensation control signal (digital signal). Alternatively, the digital signal obtained by the A/D conversion may be compensated in each of the sub-A/D conversion circuits (ADCs) 1 to 4. To take an example, using an adaptive algorithm for minimizing a mean square value (LMS) of a difference $(e[n]=d[n]-y[n])$ between an output $(y[n])$ of the sub-A/D conversion circuit (ADC) 1 and an teaching signal $(d[n])$, which is an output signal of the reference A/D conversion circuit (ADC) 5, a gain vector Kv is found to update a weight vector (refer to the above Equation (3), for example). Then, by an inner product between an output vector of the sub-A/D conversion circuit (ADC) 1 and the weight vector (as in the linear filtering in the above Equation (1) or the non-linear filtering in the above Equation (2), for example), an output may be obtained. The same may be applied to each of the sub-A/D conversion circuits (ADCs) 2 to 4. In this case, the weight vector Wv[n], for example, is employed as the compensation control signal (compensation coefficient) to be supplied from the control unit 8 to each sub-A/D conversion circuits (ADCs) 1 to 4. Then, by the weighting coefficient whose inner product (convolution) with the output digital signal of each of the sub-A/D conversion circuits (ADCs) 1 to 4 is calculated, a filter characteristic is adjusted, so that an offset, a gain, and a frequency characteristic of each sub-A/D conversion circuit are adjusted.

As described above, by repeating adjustment of the characteristic of each of the sub-A/D conversion circuits (ADCs) 1 to 4 in a background during operation of each of the sub-A/D conversion circuits (ADCs) 1 to 4 such that an error between an output of each sub-A/D conversion circuits (ADCs) 1 to 4 and an output of the reference A/D conversion circuit (ADC) 5 is minimized, characteristics can be made uniform among the sub-A/D conversion circuits (ADCs) 1 to 4, even if the characteristics of the sub-A/D conversion circuits (ADCs) 1 to 4 vary.

In this exemplary embodiment, the reference A/D conversion circuit (ADC) 5 may have a resolution that is equivalent or less than that of each of the sub-A/D conversion circuits (ADCs) 1 to 4. A sampling rate (A/D conversion rate) of the reference A/D conversion circuit (ADC) 5 may be reduced to $4/(4 \times n+1)$ of that of each of the sub-A/D conversion circuits (ADCs) 1 to 4. For this reason, according to this exemplary embodiment, the circuit design can be simplified and an increase in the circuit area and an increase in power consumption can be suppressed.

Figure 2:
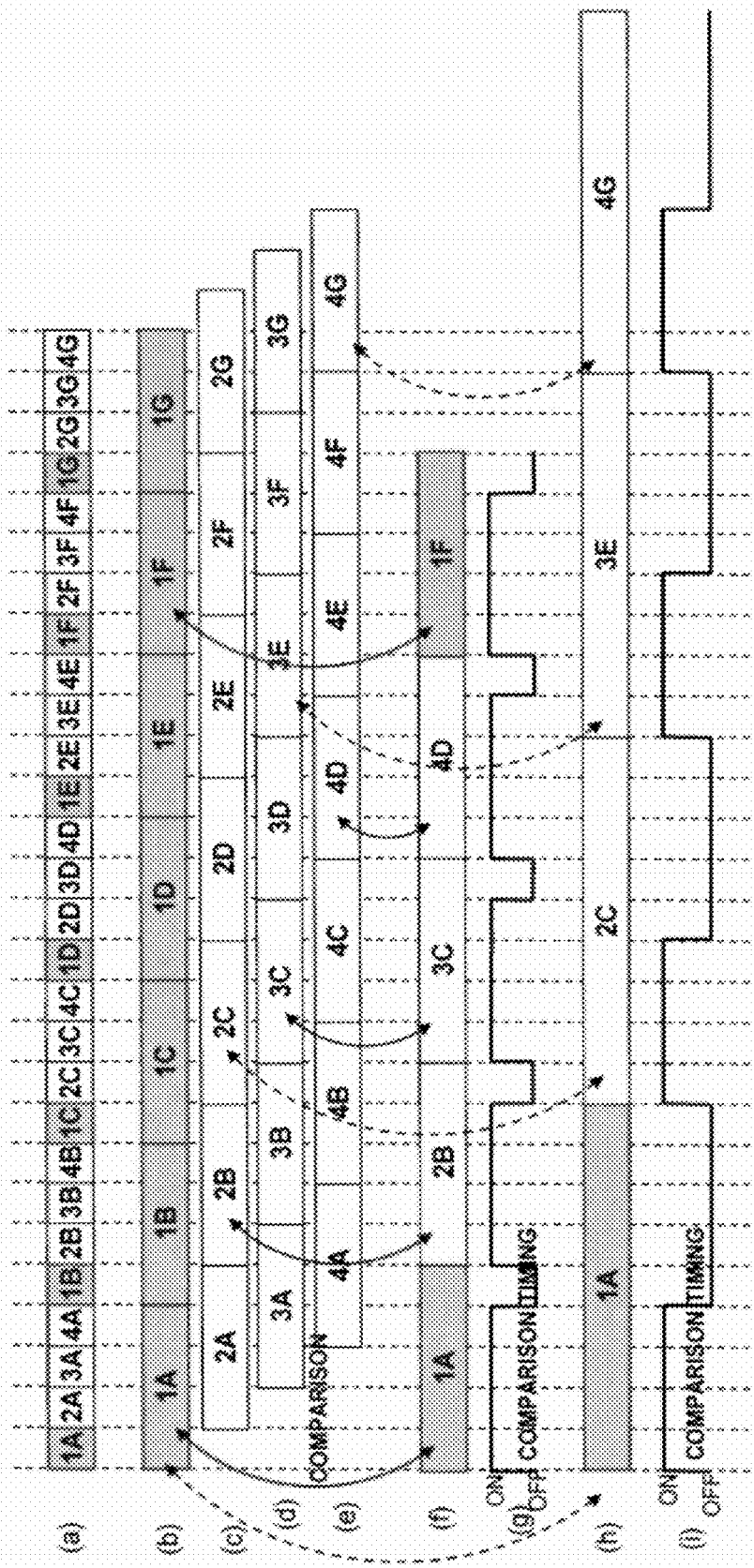
FIG. 2 is a timing chart for explaining operation in FIG. 1.

FIG. 2 is a time chart for explaining operation of the exemplary embodiment shown in FIG. 1. (a) of FIG. 2 shows effective operation of the time-interleaved A/D conversion apparatus in FIG. 1, and the sampling frequency of the time-interleaved A/D conversion apparatus is set to fs [Hz]. That is, (a) of FIG. 2 shows a digital signal sequence obtained by analog-to-digital conversion of an analog input data signal substantially at the sampling frequency of fs [Hz] (corresponding to a time-discrete analog signal obtained by sampling the analog input data signal at substantially the sampling frequency of fs), and is obtained by cyclically selecting (multiplexing) each of outputs (digital signals) of the sub-A/D conversion circuits (ADCs) 1 to 4 that perform time-interleaved operation, at the frequency of fs.

(b) to (e) of FIG. 2 schematically show four-parallel time-interleaved processing by the sub-A/D conversion circuits (ADCs) 1 to 4 using the frequency fs/4 [Hz]. That is, (b) to (e) of FIG. 2 respectively show digital signal sequences obtained by analog-to-digital conversion of the analog input data signal by the sub-A/D conversion circuits (ADCs) 1 to 4, respectively, at the conversion frequency of fs/4.

The sub-A/D conversion circuit ADC 1 outputs each of analog-to-digital conversion results 1A, 1B, 1C, 1D, and so on, in response to the clock CLK1 having the frequency of fs/4 for each period of 4/fs (=1/(fs/4)).

The sub-A/D conversion circuit ADC 2 outputs each of analog-to-digital conversion results 2A, 2B, 2C, 2D, and so on, in response to the clock CLK2 (having the frequency of fs/4 and with a phase thereof delayed with respect to the clock CLK1 by 90 degrees), for each period of 4/fs.

The sub-A/D conversion circuit ADC 3 outputs each of analog-to-digital conversion results 3A, 3B, 3C, 3D, and so on, in response to the clock CLK3 (having the frequency of fs/4 and with a phase thereof delayed with respect to the clock CLK1 by 180 degrees), for each period of 4/fs.

The sub-A/D conversion circuit ADC 4 outputs each of analog-to-digital conversion results 4A, 4B, 4C, 4D, and so on, in response to the clock CLK4 (having the frequency of fs/4 and with a phase is delayed with respect to the clock CLK1 by 270 degrees), for each period of 4/fs. Each of the sub-A/D conversion circuits 1 to 4 holds each of the analog-to-digital results during the time interval of 4/fs, though not limited thereto.

The digital signal sequence of the analog-to-digital conversion results: 1A, 2A, 3A, 4A, 1B, 2B, 3B, 4B, 1C, 2C, 3C, 4C, 1D, 2D, 3D, 4D, and so on, sampled at the frequency of fs, in (a) of FIG. 2 is obtained by cyclically selecting (multiplexing) each of the outputs of the sub-A/D conversion circuits (ADCs) 1 to 4 in (b) to (e) of FIG. 2 (in the order of the sub-A/D conversion circuits ADC1, ADC2, ADC3, ADC4, ADC1, ADC2, ADC3, ADC4, and so on, in (a) to (i) of FIG. 2), at the frequency of fs.

(f) of FIG. 2 schematically shows an output of the reference A/D conversion circuit (ADC) 5 that samples the analog input signal at a frequency of fs/5 [Hz] where n is set to "1" in the frequency of fs/(4×n+1) (obtained by frequency-dividing the frequency of fs by (4×n+1)). The reference A/D conversion circuit ADC 5 performs analog-to-digital conversion of the analog input signal of (a) of FIG. 2 at the frequency of fs/5 to output each of conversion results 1A, 2B, 3C, and so on, for each period of 5/fs (=1/(fs/5)). The reference A/D conversion circuit ADC 5 outputs values 1A, 2B, 3C, 4D, and so on to the control unit 8, for every five samples among the sample value sequence of 1A, 2A, 3A, 4A, 1B, 2B, 3B, 4B, 1C, 2C, 3C, 4C, 1D, 2D, 3D, 4D, and so on in (a) of FIG. 2. The reference A/D converter 5 is shown in (f) of FIG. 2 to hold each analog-to-digital result during the time interval of 5/fs, though not limited thereto.

The control unit 8 sequentially compares an output (digital signal) of the reference A/D conversion circuit (ADC) 5 with an output (digital signal) of each of the sub-A/D conversion circuit (ADC) 1 to 4, for each period of the clock CLK 5 (=5/fs), as shown in (g) of FIG. 2.

As described above, the cycle of the comparison process by the control unit 8 may be 5/fs [sec], which is a low speed. Reference symbol ON (High) in (g) of FIG. 2 corresponds to comparison ON (comparison enable), and reference symbol OFF (Low) corresponds to comparison OFF (comparison disable). As shown in (g) of FIG. 2, four cycles (4/fs [sec]) from a beginning of the time interval of five cycles of 5/fs is set to comparison ON, the last one cycle (1/fs [sec]) is set to comparison OFF.

Referring to (a) to (i) of FIG. 2, solid-lines with arrows at both ends thereof between (f) and (b) of FIG. 2, (f) and (c) of FIG. 2, (f) and (d) of FIG. 2, and (f) and (e) of FIG. 2 schematically show the process (corresponding relationships) of the comparisons as follows sequentially performed by the control unit 8:

comparison between the output "1A" of the reference A/D conversion circuit ADC 5 in (f) of FIG. 2 and the output "1A" of the A/D conversion circuit ADC 1 in (b) of FIG. 2 by the control unit 8 in a first cycle;

comparison between the output "2B" of the reference A/D conversion circuit ADC 5 in (f) of FIG. 2 and the output "2B" of the A/D conversion circuit ADC 2 in (c) of FIG. 2 in a sixth (=(4×1+1)+1) cycle;

comparison between the output "3C" of the reference A/D conversion circuit ADC 5 in (f) of FIG. 2 and the output "3C" of the A/D conversion circuit ADC 3 in (d) of FIG. 2 in an eleventh (=(2×(4×1+1)+1) cycle;

comparison between the output "4D" of the reference A/D conversion circuit ADC 5 in (f) of FIG. 2 and the output "4D" of the A/D conversion circuit ADC 4 in (e) of FIG. 2 in a seventeenth (=(3×(4×1+1)+1) cycle; and cyclically again, comparison between the output "1F" of the reference A/D conversion circuit ADC 5 in (f) of FIG. 2 and the output "1F" of the A/D conversion circuit ADC 1 in (b) of FIG. 2 in a twenty-first (=(4×(4×1+1)+1) cycle.

The control unit 8 receives the clock signal CLK having the frequency of fs and the frequency-divided-by-five clock CLK 5 from the clock generation unit 7. The control unit 8 performs control such that an output (teaching signal) of the reference A/D conversion circuit (ADC) 5 is compared with one of outputs of the sub-A/D conversion circuits (ADCs) 1 to 4 during four cycles of the clock CLK from a rise of the frequency-divided-by-four clock CLK 5 from Low to High, and the comparison is OFF in a fifth cycle of the clock CLK, for example. This control is performed for the following reason. Each of the sub-A/D conversion circuits (ADCs) 1 to 4 outputs same data for the time interval of four cycles (4/fs [sec]) of the clock CLK, but outputs a subsequent analog-to-digital conversion result of the analog input data signal in the fifth cycle of the clock CLK. This output is different from the output (teaching signal) of the reference A/D conversion circuit (ADC) 5 that outputs the same digital signal (analog-to-digital conversion result) during one period of 5/fs of the clock CLK5 (five cycles of the clock CLK). To take an example, the sub-A/D conversion circuit (ADC) 1 in (b) of FIG. 2 provides the output "1A" during the time interval of four cycles (4/fs [sec]) of the clock CLK (having the frequency of fs) and then provides the output "1B" in the fifth cycle of the clock CLK. At this point, the reference A/D conversion circuit (ADC) 5 in (f) of FIG. 2 provides the output "1A". Then, control is performed such that the comparison is OFF in the fifth cycle of the clock CLK. Alternatively, instead of performing control such that comparison is ON or OFF by the control unit 8, an output (teaching signal) of the reference A/D conversion circuit (ADC) 5 and an output of the sub-A/D conversion circuit (ADC) targeted for comparison may be latched, in response to the clock CLK 5, and the latched results may be compared.

(h) and (i) of FIG. 2 show outputs when n is set to two in the conversion frequency of fs/(4×n+1) of the reference A/D conversion circuit (ADC) 5. The conversion frequency of the reference A/D conversion circuit (ADC) 5 is set to fs/(4×n+1)=fs/9, which shows that the sampling rate becomes further lower.

Broken-lines having arrows at both ends thereof between (h) and (b) of FIG. 2, (h) and (c) of FIG. 2, (h) and (d) of FIG. 2, and (h) and (e) of FIG. 2 schematically show the process of comparisons as follows sequentially performed by the control unit 8:

comparison between an output "1A" of the reference A/D conversion circuit ADC 5 in (h) of FIG. 2 and the output "1A" of the A/D conversion circuit ADC 1 in (b) of FIG. 2 in the first cycle;

comparison between an output "2C" of the reference A/D conversion circuit ADC 5 in (h) of FIG. 2 and the output "2C" of the A/D conversion circuit ADC 2 in (b) of FIG. 2 in a tenth (=(4×2+1)+1) cycle;

comparison between an output "3E" of the reference A/D conversion circuit ADC 5 in (h) of FIG. 2 and the output "3E" of the A/D conversion circuit ADC 3 in an nineteenth (=(2×(4×2+1)+1) cycle; and comparison between an output "4G" of the reference A/D conversion circuit ADC 5 in (h) of FIG. 2 and the output "4G" of the A/D conversion circuit ADC 4 in a twenty-eighth (=(3×(4×2+1)+1) cycle.

The control unit 8 in FIG. 1 sequentially compares an output of the reference A/D conversion circuit (ADC) 5 with an output of each of the four sub-A/D conversion circuits (ADCs) 1 to 4 connected in parallel, for each period of 9/fs (=1/fs/9) shown in (i) of FIG. 2. That is, the cycle of the comparison process by the control unit 8 may be low such as 9/fs [sec]. Reference symbol ON (High) in (i) of FIG. 2 corresponds to comparison ON, while reference symbol OFF (LOW) corresponds to comparison OFF. The former half four cycles of the period of 9/fs (time interval of nine cycles of the clock CLK) are set to be used for comparison, and the latter half five cycles of the period of 9/fs are set to be in a comparison OFF state. It may also be configured thin the control unit 8 latches a corresponding output of the sub-A/D conversion circuits (ADCs) 1 to 4 in its inside for each nine cycles of the clock CLK having the frequency of fs, using a rising edge of the clock signal CLK5, for example, and compares the latched output of the sub-A/D conversion circuit (ADC) with an output of the reference A/D conversion circuit (ADC) 5.

In the timing diagram in (a) to (i) of FIG. 2, the sub-A/D conversion circuit (ADC) 1 is shown as being configured to output the analog-to-digital conversion result 1A from a first cycle of the period of 4/fs (four cycles of the clock CLK having the frequency of fs) and hold the output 1A during the four cycles, as shown in (b) of FIG. 2, for example. The sub-A/D conversion circuit (ADC) 1, however, may be configured not to provide an output in the first cycle of the clock CLK having the frequency of fs, output the analog-to-digital conversion result 1A from a second cycle of the clock CLK, and hold the output 1A during two cycles of third and fourth cycles of the clock CLK (in this case, a first output cycle of the output 1A in (b) of FIG. 2 becomes the second cycle after start of the conversion). The other sub-A/D conversion circuits (ADCs) 2 to 4 may have the same configuration. In this case, the reference A/D conversion circuit (ADC) 5 may be configured not to provide an output in the first cycle of the period of 5/fs (five cycles of the clock CLK having the frequency of fs), output the analog-to-digital conversion result 1A from the second cycle of the period of 5/fs, and hold the output 1A during three cycles of the third, fourth, and fifth cycles. The time interval of comparison ON is three cycles of the five cycles of the CLK having the frequency of fs in which an output of each sub-A/D conversion circuit (ADC) is provided, and the time interval of comparison OFF is the remaining two cycles, in the control unit 8. Alternatively, the sub-A/D conversion circuit (ADC) 1 may be configured not to provide an output in the first and second cycles of the clock CLK having the frequency of fs in the conversion period of the period of 4/fs (four cycles of the clock CLK having the frequency of fs), output the analog-to-digital result 1A in the third cycle, and then hold the analog-to-digital result 1A in the subsequent fourth cycle (in this case, the first output cycle of the output 1A in (b) of FIG. 2 becomes the third cycle after start of the conversion). The other sub-A/D conversion circuits (ADCs) 2 to 4 may have the same configuration. In this case, the reference A/D conversion circuit (ADC) 5 may be configured not to output an analog-to-digital conversion result in the first and second cycles of the period of 5/fs (five cycles of the clock CLK having the frequency of fs), output the analog-to-digital conversion result 1A from the third cycle, and then to hold the output 1A during subsequent three cycles of the third, fourth, and fifth cycles. The time interval of comparison ON is two cycles of the five cycles of the CLK having the frequency of fs where an output of each sub-A/D conversion circuit (ADC) is provided, and the time interval of comparison OFF is the remaining period (of three cycles), in the control unit 8.

As the value of n is increased in the sampling frequency (analog-to-digital conversion operation frequency) fs/(4×n+1) of the reference A/D conversion circuit (ADC) 5, an analog-to-digital conversion operation of the reference A/D conversion circuit (ADC) 5 is performed at a lower speed, and the cycle of the comparison process may be reduced. In this case, however, the time needed for calibration will increase.

During system operation where a normal A/D conversion operation is performed, characteristic variations among the sub-A/D conversion circuits (ADC 1 to ADC 4) generated due to a power supply variation, a temperature change, an aging change, and the like are calibrated in the A/D conversion apparatus. The factors that cause such variations change relatively slowly. Thus, there is no problem even if a calibration process speed and hence a conversion speed of the reference A/D conversion circuit (ADC) 5, speeds of the comparison operation and the generation process of a compensation control signal in the control unit 8 are all low with respect to the frequency of fs [Hz]. The exemplary embodiment is suitable for use in a communication apparatus in which the sub-A/D conversion circuits ADC 1 to ADC 4 are used as an A/D conversion circuit for a main signal.

A description about the exemplary embodiment shown in FIG. 1 be further given below in connection with some exemplary embodiments. In the following exemplary embodiments, an example is shown where the invention is applied to an A/D conversion apparatus that implements a sampling frequency of fs [Hz] with the number of interleaves (number of sub-A/D conversion circuits connected in parallel) M set to four. The number of interleaves M is not, of course, limited to four.

Exemplary Embodiment 1

Figure 3:
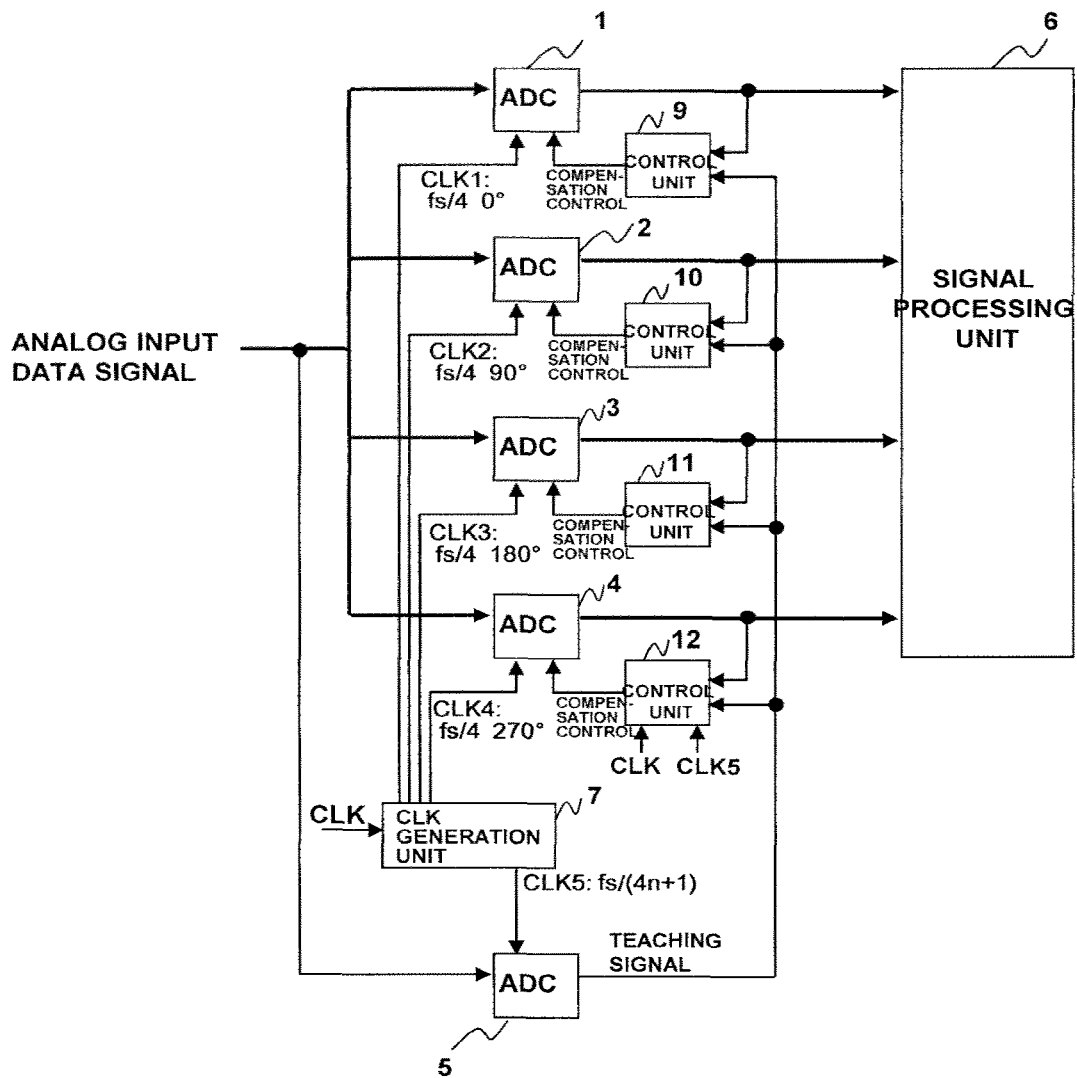
FIG. 3 is a diagram showing a configuration of a first exemplary embodiment of the present invention.

FIG. 3 is a diagram showing a configuration of a first exemplary embodiment of the present invention. Referring to FIG. 3, control units 9 to 12 are provided as the control unit 8 in FIG. 1, corresponding to sub-A/D conversion circuits ADC 1 to ADC 4. The control units 9 to 12 receive an output of a reference A/D conversion circuit ADC 5 in common, respectively receive outputs of the sub-A/D conversion circuits (ADCs) 1 to 4 to compare with the output of the sub-A/D conversion circuit ADC 5, and respectively output compensation control signals to the sub-A/D conversion circuits (ADCs) 1 to 4.

More specifically, referring to FIG. 3, an A/D conversion apparatus in this exemplary embodiment includes the four sub-A/D conversion circuits (ADCs) 1 to 4 connected in parallel, a digital signal processing unit 6 that processes the outputs of the four sub-A/D conversion circuits (ADCs) 1 to 4, the reference A/D conversion circuit (ADC) 5, a clock generation unit 7 that respectively distributes sampling clock signals to the sub-A/D conversion circuits (ADCs) 1 to 4 and the reference A/D conversion circuit (ADC) 5, and the control units 9 to 12 that respectively compare the outputs of the sub-A/D conversion circuits (ADCs) 1 to 4 with the output of the reference A/D conversion circuit (ADC) 5 to respectively output the compensation control signals to the sub-A/D conversion circuits (ADCs) 1 to 4.

The four sub-A/D conversion circuits (ADCs) 1 to 4 connected in parallel sample an analog input data signal supplied in common, in response to four-phase clock signals (CLK1 to CLK4) having a frequency of fs/4 [Hz] and mutually shifted in timing just by 1/fs [sec] to convert the sampled analog input data signal to digital signals, as in FIG. 1. The analog input data signal is supplied in common to the reference A/D conversion circuit (ADC) 5 as well. As in FIG. 1, the reference A/D conversion circuit (ADC) 5 samples the analog input data signal, in response to a clock signal CLK5 having a frequency of fs/(4×n+1) [Hz] (n=1, 2, 3 . . . ).

The control units 9 to 12 use an output signal of the reference A/D conversion circuit (ADC) 5 as an teaching signal, and respectively compare the respective outputs of the sub-A/D conversion circuits (ADCs) 1 to 4 with the output signal of the reference A/D conversion circuit (ADC) 5 to respectively give the compensation control signals to the sub-A/D conversion circuits (ADCs) 1 to 4 such that a difference between each of the outputs of the sub-A/D conversion circuits (ADCs) 1 to 4 and the output signal of the reference A/D conversion circuit (ADC) 5 is minimized. The control units 9 to 12 respectively perform DC offset adjustments, gain adjustments, and sampling phase adjustments for the sub-A/D conversion circuits (ADCs) 1 to 4, using the compensation control signals. As described above, by generating the compensation control signals and repeating adjustment of characteristics of each of the sub-A/D conversion circuits (ADCs) 1 to 4 in a background based on the outputs of the reference A/D conversion circuit (ADC) 5 and the sub-A/D conversion circuits (ADCs) 1 to 4 such that an error between an output of each sub-A/D conversion circuits (ADCs) and an output of the reference A/D conversion circuit (ADC) 5 is minimized, characteristics of the sub-A/D conversion circuits (ADCs) 1 to 4 can be made uniform even if the characteristics of the sub-A/D conversion circuits (ADCs) 1 to 4 vary.

The reference A/D conversion circuit (ADC) 5 may have a resolution equivalent to or less than that of each of the sub-A/D conversion circuits (ADC) 1 to 4 of a main signal system, and a sampling rate of the reference A/D conversion circuit (ADC) 5 is reduced to 4/(4×n+1).

Figure 4:
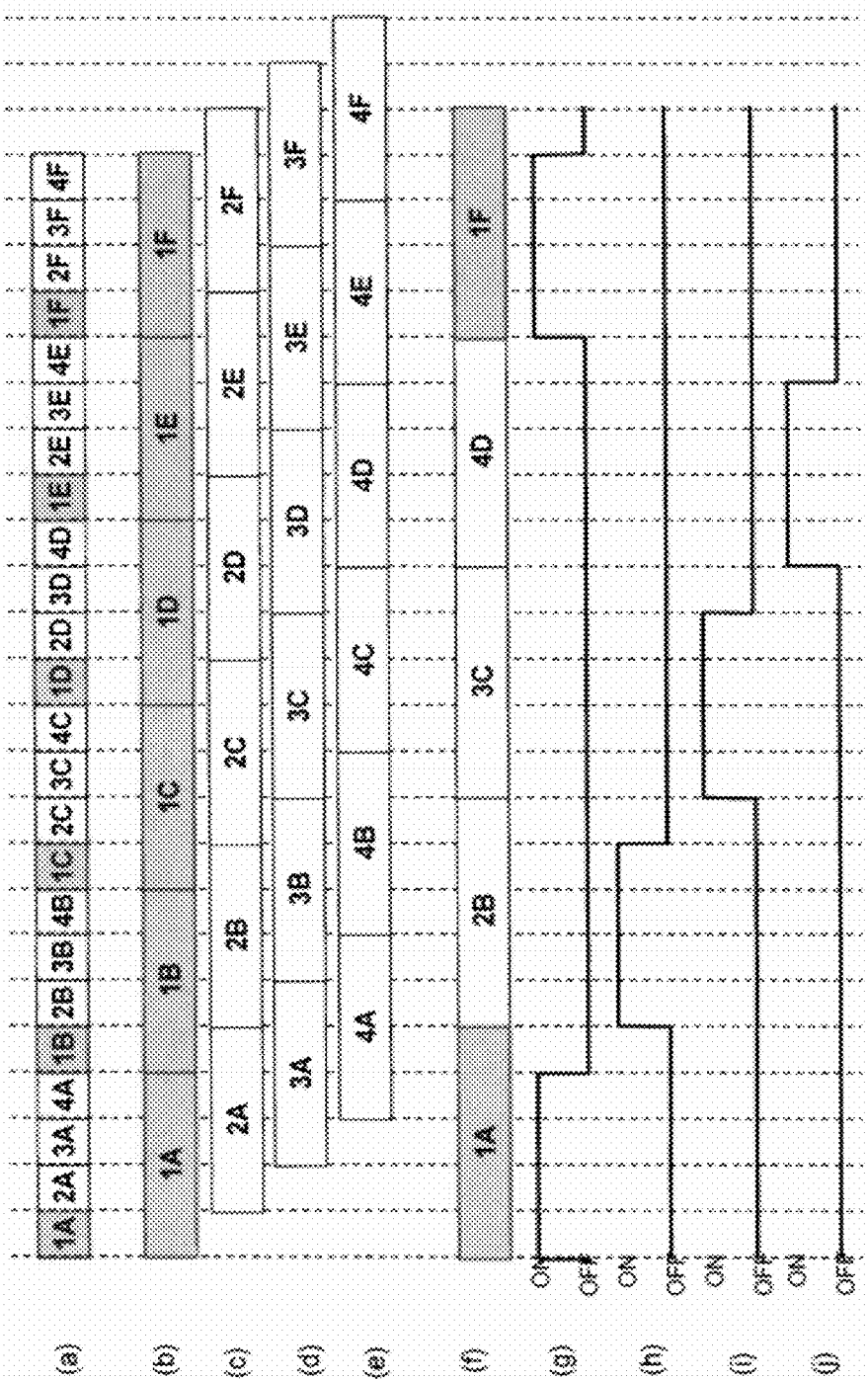
FIG. 4 is a timing chart for explaining operation of the first exemplary embodiment of the present invention.

(a) to (j) of FIG. 4 are a timing diagram for explaining operation of the exemplary embodiment shown in FIG. 3. Referring to (a) to (j) of FIG. 4, the sampling frequency of the reference A/D conversion circuit (ADC) 5 is set to fs/5 (where n=1 in a frequency fs/(4×n+1)).

(a) of FIG. 4 shows effective operation of the A/D conversion apparatus of a time-interleaved type, and a sampling frequency of the time-interleaved A/D conversion apparatus is fs [Hz] (fs indicates a frequency of a clock CLK). (b) to (e) of FIG. 4 show four-parallel time-interleaved processing of the sub-A/D conversion circuits (ADCs) 1 to 4, using a frequency of fs/4 [Hz]. (f) of FIG. 4 shows an output of the reference A/D conversion circuit (ADC) 5 that performs sampling at the frequency of fs/5 [Hz] when n=1 in fs/(4×n+1) [Hz], and this output becomes the teaching signal. (a) to (f) of FIG. 4 are the same as (a) to (f) of FIG. 2.

(g) to (j) of FIG. 4 are diagrams showing timings of comparisons by the control units 9 to 12 in FIG. 3. During a time interval of 4/fs which is the period of the conversion by each of the sub-A/D conversion circuits ADC 1 to ADC4, comparison is set to be ON. During a time interval of 16/fs, which is a sum of the remainder of 1/fs+comparison time interval (=3×(1×4+1)/fs) by the three control units, the comparison is set to be OFF. Accordingly, as shown in (g) to (j) of FIG. 4, the control units 9 to 12 in FIG. 3 perform comparison operations in response to multi-phase clocks, each having a time interval of 20/fs (frequency fs/20), mutually shifted in phase by 5/fs, and being ON (High) for the initial time interval of 4/fs and being OFF (Low) for the remaining time.

A comparison timing signal shown in each of (g) to (j) of FIG. 4 may be generated from the clock CLK and the frequency-divided-by-(4×n+1) clock CLK 5 at each of the control units 9 to 12. Alternatively, the output clock CLK5 may be frequency-divided by four to generate multi-phase clocks mutually shifted in phase by 5/fs and being High for a time interval of 4/fs, and may be supplied to the control units 9 to 12, as respective comparison enable signals for the control units 9 to 12. Referring to FIG. 3, input of the clocks CLK and CLK5 to the control units 9 to 11 is omitted for simplification of the drawing.

The control unit 9 in FIG. 3 compares outputs 1A and 1F among outputs (1A, . . . 1F, . . . ) of the sub-A/D conversion circuit (ADC) 1 in (b) of FIG. 4 and outputs 1A and 1F of the teaching signal (1A, 2B, 3C, 4D, 1F, . . . ) shown in (f) of FIG. 4 at timings shown in (g) of FIG. 4 to calculate compensation control signals such that a difference between the outputs 1A and a difference between the outputs 1F are minimized, thereby calibrating the sub-A/D conversion circuit (ADC) 1.

The control unit 10 in FIG. 3 compares an output 2B among outputs (2A, 2B, . . . ) of the sub-A/D conversion circuit (ADC) 2 in (c) of FIG. 4 with an output 2B of the teaching signal (1A, 2B, . . . ) shown in (f) of FIG. 4 at a timing in (h) of FIG. 4 to calculate a compensation control signal such that a difference between the outputs 2B is minimized, thereby calibrating the sub-A/D conversion circuit (ADC) 2.

The control unit 11 in FIG. 3 compares an output 3C among outputs (3A, 3B, 3C . . . ) of the sub-A/D conversion circuit (ADC) 3 in (d) of FIG. 4 with an output 3C of the teaching signal (3C, . . . ) shown in (f) of FIG. 4 at a timing in (i) of FIG. 4 to calculate a compensation control signal such that a difference between the outputs 3C is minimized, thereby calibrating the sub-A/D conversion circuit (ADC) 3.

The control unit 12 in FIG. 3 compares an output 4D among outputs (4A, 4B, 4C, 4D, 4E . . . ) of the sub-A/D conversion circuit (ADC) 4 in (e) of FIG. 4 with an output 4D of the teaching signal (1A, 2B, 3C, 4D, 1F, . . . ) shown in (f) of FIG. 4 at a timing in (j) of FIG. 4 to calculate a compensation control signal such that a difference between the outputs 4D is minimized, thereby calibrating the sub-A/D conversion circuit (ADC) 4.

The sampling frequency of the reference A/D conversion circuit (ADC) 5 may be fs/(4×n+1) [Hz]. As the value of n is increased, operation of the reference A/D conversion circuit (ADC) 5 is performed at a lower speed, and the cycle of the comparison process may be reduced. In this case, however, the time needed for calibration will increase. When calibrating characteristic variations among the sub-A/D conversion circuits generated due to a power supply variation, a temperature change, an aging change, and the like during system operation, there is no particular problem even if a calibration process speed is low. It is because the factors that may cause such variations change relatively slowly.

Exemplary Embodiment 2

Figure 5:
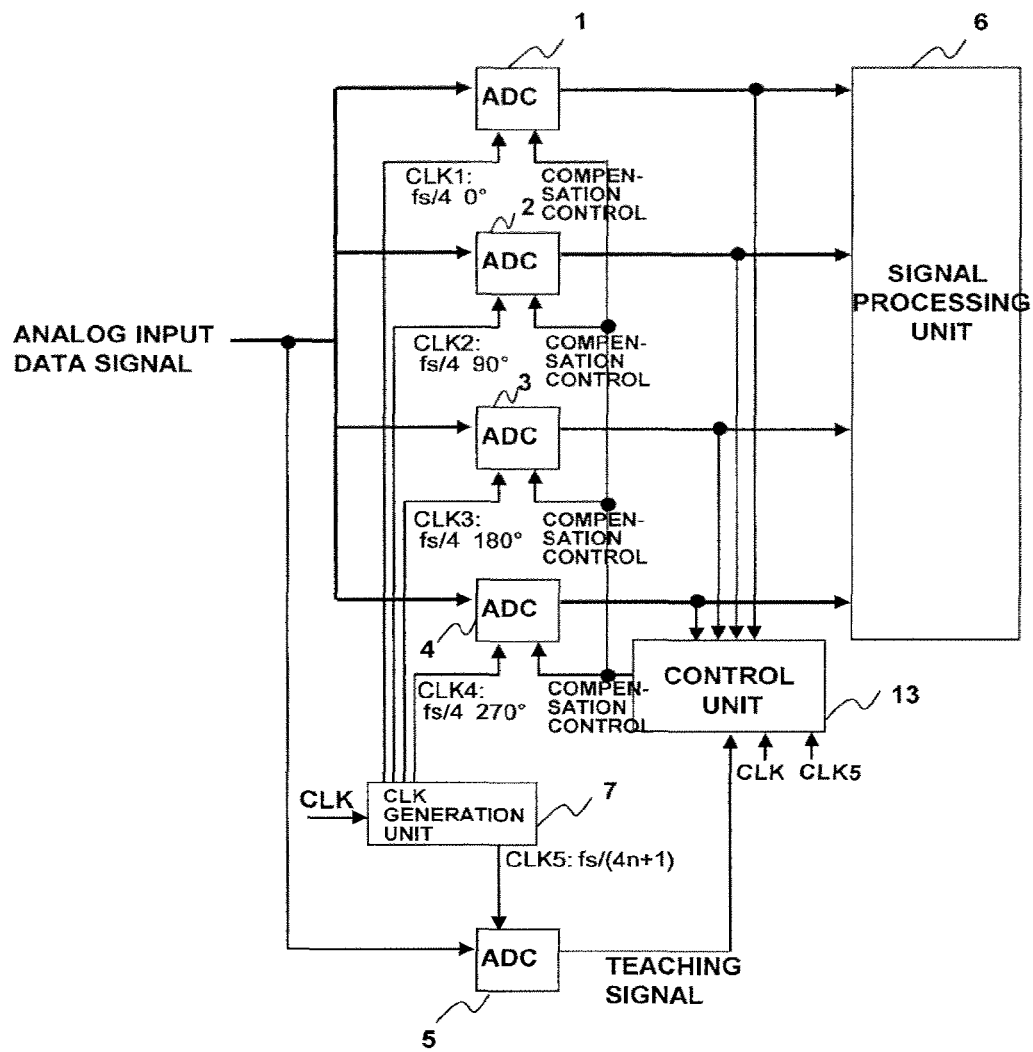
FIG. 5 is a diagram showing a configuration of a second exemplary embodiment of the present invention.

Next, a second exemplary embodiment of the present invention will be described. FIG. 5 is a diagram showing a configuration of the second exemplary embodiment of the present invention. Referring to FIG. 5, an A/D conversion apparatus in this exemplary embodiment includes a reference A/D conversion circuit (ADC) 5, a clock generation unit 7 that respectively distributes sampling clock signals to sub-A/D conversion circuits (ADCs) 1 to 4 and the reference A/D conversion circuit (ADC) 5, and a control unit 13 that compares respective outputs of the sub-A/D conversion circuits (ADCs) 1 to 4 with an output of the reference A/D conversion circuit (ADC) 5 to output a compensation control signal to each of the sub-A/D conversion circuits (ADCs) 1 to 4, in addition to the four sub-A/D conversion circuits (ADCs) 1 to 4 connected in parallel and a digital signal processing unit 6 that processes the outputs of those sub-A/D conversion circuits (ADCs) 1 to 4.

The four sub-A/D conversion circuits (ADCs) 1 to 4 connected in parallel sample an analog input data signal, in response to four-phase clock signals (CLK1 to CLK4) having a frequency of fs/4 [Hz] and mutually shifted in phase by (¼)×(1/(fs/4)) [sec] to convert the sampled analog input data signal to digital signals. In this case, the analog input data signal is also supplied to the reference A/D conversion circuit (ADC) 5 disposed in parallel. The reference A/D conversion circuit (ADC) 5 samples the analog input data signal, in response to a clock signal CLK5 having a frequency of fs/(4×n+1) [Hz] (n=1, 2, 3 . . . ).

An output signal of the reference A/D conversion circuit (ADC) 5 is set to an teaching signal, and is compared with an output of each of the sub-A/D conversion circuits (ADCs) 1 to 4 by the control unit 13, and the compensation control signal is supplied to each of the sub-A/D conversion circuits (ADCs) 1 to 4 such that a difference between the output signal of the reference A/D conversion circuit (ADC) 5 and the output of each of the sub-A/D conversion circuits (ADCs) 1 to 4 is minimized. Then, using the compensation control signal, DC offset adjustment, gain adjustment, and sampling phase adjustment are performed for each of the sub-A/D conversion circuits (ADCs) 1 to 4. Adjustment of characteristics of the sub-A/D conversion circuits (ADCs) 1 to 4 is repeated such that an error between an output of each of the sub-A/D conversion circuits (ADCs) 1 to 4 and an output of the reference A/D conversion circuit (ADC) 5 is minimized in a background, as described above. Even if the characteristics of the sub-A/D conversion circuits (ADCs) 1 to 4 vary, the characteristics of the sub-A/D conversion circuits (ADCs) 1 to 4 can be made uniform as a result of the adjustment. The reference A/D conversion circuit (ADC) 5 may have a resolution equivalent to or less than that of each of the sub-A/D conversion circuits (ADC) 1 to 4 of a main signal system, and a sampling rate of the reference A/D conversion circuit (ADC) 5 is reduced to even 4/(4×n+1).

Figure 6:
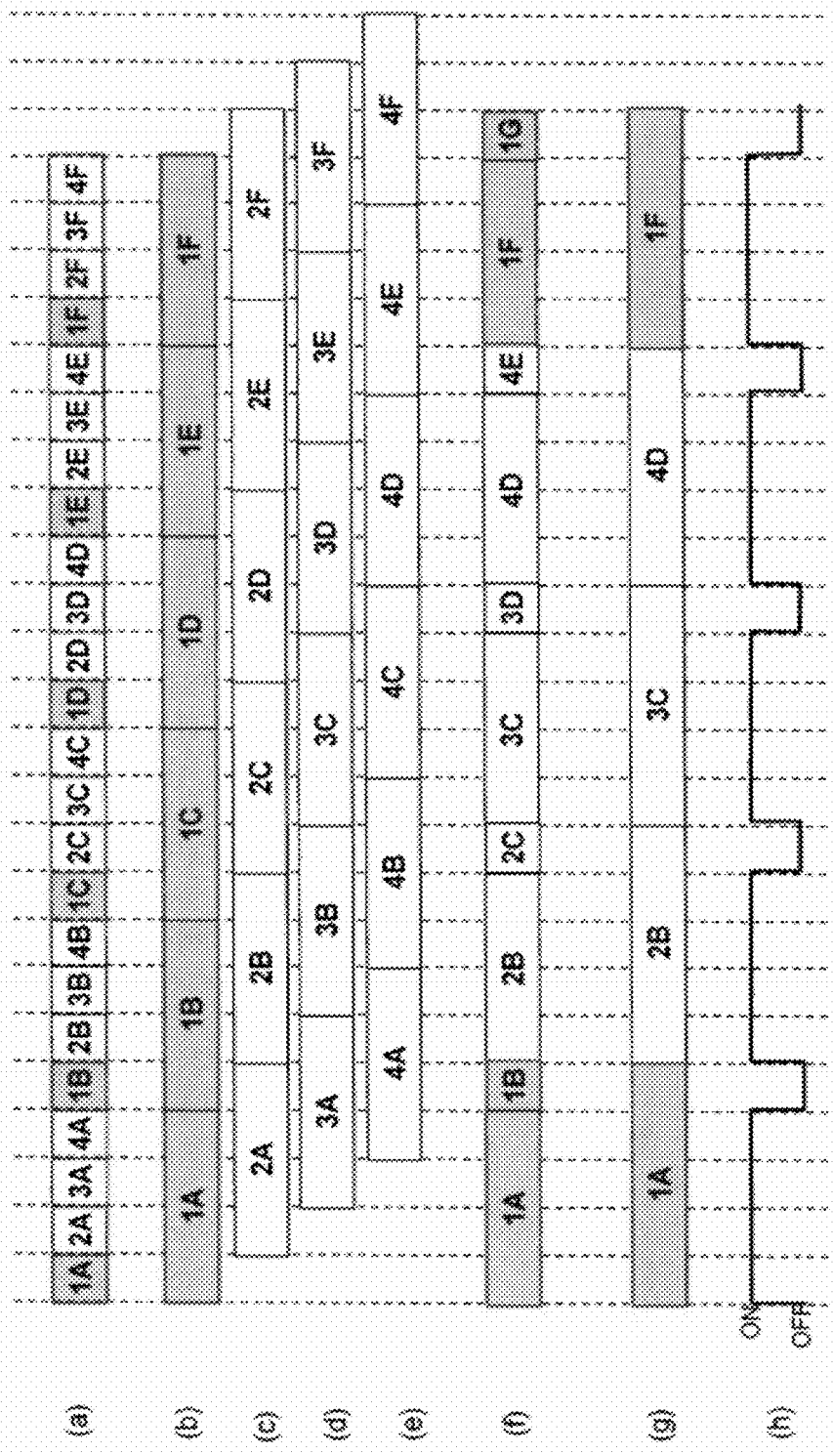
FIG. 6 is a timing chart for explaining operation of the second exemplary embodiment of the present invention.

(a) to (h) of FIG. 6 are a timing diagram for explaining operation of the second exemplary embodiment. A sampling frequency of the reference A/D conversion circuit (ADC) 5 is set to fs/5 (where n=1 in a frequency fs/(4×n+1)). (a) to (e) of FIG. 6 are the same as (a) to (e) of FIG. 2. (f) of FIG. 6 shows a signal sequence obtained by sequentially selecting an output of each of the sub-A/D conversion circuits (ADCs) 1 to 4 by the control unit 13 for each period of fs/5. (g) of FIG. 6 shows an output of the reference A/D conversion circuit (ADC) 5 sampled at the frequency fs/5 [Hz], which becomes the teaching signal. The control unit 13 compares the signal sequence shown in (f) of FIG. 6 obtained by selecting and outputting the output of each of the sub-A/D conversion circuits (ADCs) 1 to 4 with the teaching signal shown in (g) of FIG. 6 in a time interval of a waveform shown in (h) of FIG. 6 indicating comparison ON, calculates a compensation control signal (compensation coefficient) such that a difference between the teaching signal and the output of each of the sub-A/D conversion circuits (ADCs) 1 to 4 is minimized, and gives the compensation control signal to each of the A/D conversion circuits (ADCs) 1 to 4, thereby calibrating the sub-A/D conversion circuits (ADCs) 1 to 4. Comparison timings in (i) of FIG. 6 are the same as those in (g) of FIG. 2.

The control unit 13 in FIG. 5 receives an output 1A from the sub-A/D conversion circuit (ADC) 1 from a first cycle of a clock CLK (having a frequency of fs) for four cycles, and receives an output 1B from the sub-A/D conversion circuit (ADC) 1 in a fifth cycle, corresponding to (b) of FIG. 6. The output of the A/D conversion circuit (ADC) 5 is an output 1A from the first cycle to a fourth cycle of the clock CLK. Accordingly, comparison by the control unit 13 is set to be OFF in the fifth cycle of the clock CLK.

The control unit 13 in FIG. 5 receives an output 2B of the sub-A/D conversion circuit (ADC) 2 for four cycles from a sixth cycle to a ninth cycle of the clock CLK (having the frequency of fs), and receives an output 2C of the sub-A/D conversion circuit (ADC) 2 in a tenth cycle of the clock CLK, corresponding to (c) of FIG. 6. The output of the A/D conversion circuit (ADC) 5 is an output 2B from the sixth cycle to the tenth cycle. Accordingly, comparison by the control unit 13 is set to be OFF in the tenth cycle of the clock CLK.

The control unit 13 in FIG. 5 receives an output 3C of the sub-A/D conversion circuit (ADC) 3 for four cycles from an eleventh cycle to a fourteenth cycle of the clock CLK (having the frequency of fs), and receives an output 3D of the sub-A/D conversion circuit (ADC) 3 in a fifteenth cycle of the clock CLK, corresponding to (d) of FIG. 6. The output of the A/D conversion circuit (ADC) 5 is an output 3C from the eleventh cycle to the fifteenth cycle of the clock CLK. Accordingly, comparison by the control unit 13 is set to be OFF in the fifteenth cycle of the clock CLK.

The control unit 13 in FIG. 5 receives an output 4D of the sub-A/D conversion circuit (ADC) 4 for four cycles from a sixteenth cycle to a nineteenth cycle of the clock CLK (having the frequency fs), and receives an output 4E of the sub-A/D conversion circuit (ADC) 4 in a twentieth cycle of the clock CLK, corresponding to (e) of FIG. 6. The output of the A/D conversion circuit (ADC) 5 is an output 4D from the sixteenth cycle to the twentieth cycle. Accordingly, comparison by the control unit 13 is set to be OFF in the twentieth cycle of the clock CLK.

The frequency of the reference A/D conversion circuit (ADC) 5 for analog-to-digital conversion may be fs/(4×n+1) [Hz]. As the value of n is increased, operation of the reference A/D conversion circuit (ADC) 5 is performed at a lower speed, and the cycle of the comparison process may be reduced. In this case, the time needed for calibration, however, will increase. The calibration is performed to calibrate characteristic variations among the sub-A/D conversion circuits generated due to a power supply variation, a temperature change, an aging change, and the like during system operation. Since the factors that may cause such variations change relatively slowly, there is no problem even if a calibration process speed is low.

Exemplary Embodiment 3

Figure 7:
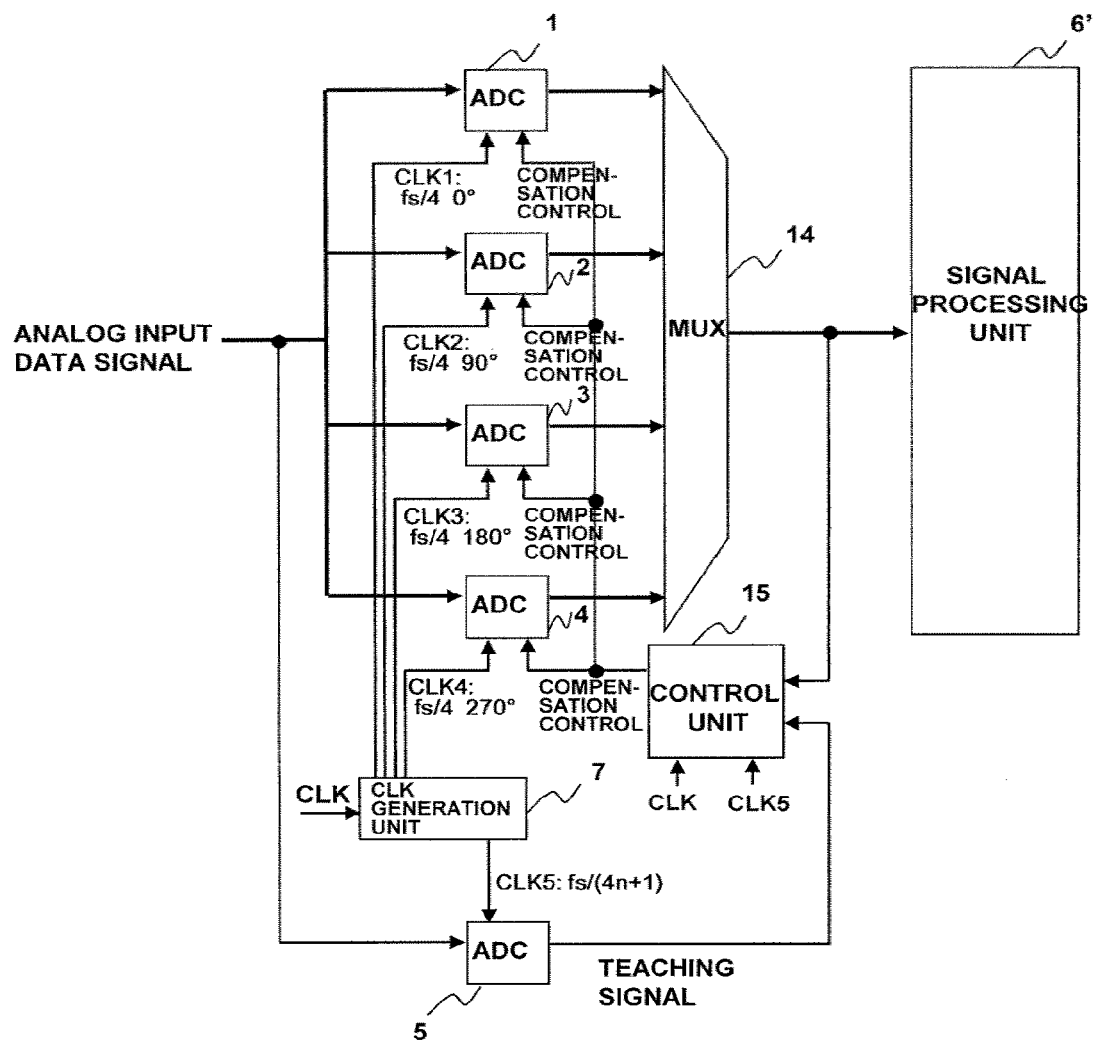
FIG. 7 is a diagram showing a configuration of a third exemplary embodiment of the present invention.

Next, a third exemplary embodiment of the present invention will be described. FIG. 7 is a diagram showing a configuration of the third exemplary embodiment of the present invention. Referring to FIG. 7, this exemplary embodiment includes a multiplexing circuit (multiplexer: MUX) 14 that multiplexes outputs of four interleaved sub-A/D conversion circuits (ADCs) 1 to 4 connected in parallel for the configuration in FIG. 1, and includes a control unit 15 that receives and compares an output of the multiplexer (MUX) 14 and an output of a reference A/D conversion circuit (ADC) 5 to generate a compensation control signal and supplies the compensation control signal to each of the sub-A/D conversion circuits (ADCs) 1 to 4. A signal processing unit 6' receives the output of the multiplexer (MUX) 14.

More specifically, an A/D conversion apparatus in this exemplary embodiment includes the four interleaved sub-A/D conversion circuits (ADCs) 1 to 4 connected in parallel, the digital signal processing unit 6' that performs signal processing of the output of the multiplexer (MUX) 14, the reference A/D conversion circuit (ADC) 5, a clock generation unit 7 that distributes sampling clock signals to the sub-A/D conversion circuits (ADC) 1 to 4 and the reference A/D conversion circuit (ADC) 5, and the control unit 15 that compares the outputs of the sub-A/D conversion circuits (ADCs) 1 to 4 and the output of the reference A/D conversion circuit (ADC) 5 to output the compensation control signal to each of the sub-A/D conversion circuits (ADCs) 1 to 4.

As in FIG. 1, the four sub-A/D conversion circuits (ADCs) 1 to 4 connected in parallel in this exemplary embodiment as well sample an analog input data signal in response to four-phase clock signals (CLK1 to CLK4) having a frequency of fs/4 [Hz] and mutually shifted in timing (phase) just by (¼)×(1/(fs/4))[sec] to convert the analog input data signal to digital signals. The analog input data signal is also supplied to the reference A/D conversion circuit (ADC) 5. The reference A/D conversion circuit (ADC) 5 samples the analog input data signal in response to a clock signal CLK5 having a frequency of fs/(4×n+1)[Hz] (n=1, 2, 3 . . . ). An output signal of the reference A/D conversion circuit (ADC) 5 is used as an teaching signal, and is compared with an output obtained by multiplexing outputs of the respective sub-A/D conversion circuits (ADCs) 1 to 4 by the control unit 15. Then, a compensation control signal (compensation coefficient) is given to the sub-A/D conversion circuits (ADCs) 1 to 4 such that a difference between the teaching signal and the output obtained by multiplexing the outputs of the respective sub-A/D conversion circuits (ADCs) 1 to 4 is minimized. DC offset adjustment, gain adjustment, and sampling phase adjustment for each of the sub-A/D conversion circuits (ADCs) 1 to 4 are performed, using the compensation control signal. As described above, adjustment of characteristics of each of the sub-A/D conversion circuits (ADCs) 1 to 4 is repeated in a background such that an error between an output of each sub-A/D conversion circuits (ADCs) and an output of the reference A/D conversion circuit (ADC) 5 is minimized. Characteristics of the sub-A/D conversion circuits (ADCs) 1 to 4 can be made uniform as a result of this adjustment, even if the characteristics of the sub-A/D conversion circuits (ADCs) 1 to 4 vary. The reference A/D conversion circuit (ADC) 5 may have a resolution equivalent to or less than that of each of the sub-A/D conversion circuits (ADC) 1 to 4 of a main signal system, so that a sampling rate of the reference A/D conversion circuit (ADC) 5 is reduced to even 4/(4×n+1).

(a) to (h) of FIG. 8 are a timing diagram for explaining operation of the third exemplary embodiment of the present invention. A sampling frequency of the reference A/D conversion circuit (ADC) 5 is set to fs/5 (where n=1 in fs/(4×n+1) [Hz]). (a) to (e) of FIG. 8 are the same as (a) to (e) of FIG. 2.

(f) of FIG. 8 shows an output of the multiplexer (MUX) 14, and is obtained by converting the signal of (a) of FIG. 2 to digital signals. The multiplexer (MUX) 14 provides cyclically switched outputs of the sub-A/D conversion circuits (ADCs) 1, 2, 3, 4, 1, 2, 3, 4, and so on, in response to a clock CL having a frequency of fs. It is assumed that the output of the multiplexer (MUX) 14 includes characteristic variation among the respective sub-A/D conversion circuits (ADCs) 1 to 4 in (a) of FIG. 8. (g) of FIG. 8 shows an output of the reference A/D conversion circuit (ADC) 5 that performs sampling at the frequency of fs/5 [Hz], and this output of the reference A/D conversion circuit (ADC) 5 becomes an teaching signal. (h) of FIG. 8 shows a signal that controls comparison between the output of the multiplexer MUX 14 and the output of the reference A/D conversion circuit (ADC) 5. Reference character ON indicates comparison ON (comparison enable), and reference character OFF indicates comparison OFF (comparison disable). An initial cycle (of 1/fs) of a time interval of 5/fs is set to be comparison ON (comparison enable), and the remaining four cycles (of 4/fs) are set to be comparison OFF (comparison disable).

The reference A/D conversion circuit (ADC) 5 in FIG. 7 provides an output 1A of the sub-A/D conversion circuit 1, an output 2B of the sub-A/D conversion circuit 2, an output 3C of the sub-A/D conversion circuit 3, an output 4D of the sub-A/D conversion circuit 4, and so on (refer to (g) of FIG. 8) at a timing of the period of 5/fs.

The control unit 15 in FIG. 7 respectively compares an output 1A, an output 2B, an output 3C, an output 4D, and so on of the multiplexer MUX 14 (in (f) of FIG. 8) in the initial time interval of 1/fs in each period of 5/fs with the output 1A, the output 2B, the output 3C, the output 4D, and so on of the reference A/D conversion circuit (ADC) 5 (in (g) of FIG. 8) to compute compensation control signals such that a difference between the outputs 1A, a difference between the outputs 2B, a difference between the outputs 3C, and a difference between the outputs 4D are minimized, thereby calibrating each of the sub-A/D conversion circuits (ADCs) 1 to 4.

The sampling frequency of the reference A/D conversion circuit (ADC) 5 in FIG. 7 may be fs/(4×n+1) [Hz]. As the value of n is increased, operation of the reference A/D conversion circuit (ADC) 5 can be performed at a lower speed, and the cycle of the comparison process may be reduced. In that case, however, the time needed for calibration will increase. An object of the proposal of the present invention is to calibrate characteristic variations among the sub-A/D conversion circuits generated due to a power supply variation, a temperature change, an aging change, and the like during system operation. Since the factors that may cause such variations change relatively slowly, there is no particular problem even if a calibration process speed is low.

As described above, according to each of the above-mentioned exemplary embodiments, in an A/D conversion apparatus of a time-interleaved system where a plurality of lower-speed sub-A/D conversion circuits sequentially perform conversion to digital signals at different sampling timings to equivalently increase a sampling rate, characteristic errors (characteristic variations) among the respective sub-A/D conversion circuits are adaptively (adaptively) calibrated to reduce a conversion error as the entirety of the A/D conversion apparatus, thereby allowing achievement of high accuracy.

Further, according to the above-mentioned exemplary embodiments, the A/D conversion circuit to be added for the teaching signal should perform sampling for each period longer than the sampling period of each sub-A/D conversion circuit. Thus, calibration of the A/D conversion apparatus can be achieved in the background while reducing an increase in the circuit size and an increase in power consumption and without increasing the difficulty level of circuit design. The present invention is applicable as means for calibrating characteristics of a plurality of sub-A/D conversion circuits to be uniform in an A/D conversion apparatus in general constituted from the plurality of sub-A/D conversion circuits, not limited to the time interleaved A/D conversion apparatus.

A calibration procedure during normal operation of the sub-A/D conversion circuits (ADCs 1 to 4) is described in the above-mentioned embodiments. In the above-mentioned exemplary embodiments, however, the following application of the calibration procedure may be performed. A test signal (analog test signal of a waveform for a converter test such as a DC ramp waveform, or a sine wave, or an AC signal) may be supplied to the sub-A/D conversion circuits (ADCs) 1 to 4 and the reference A/D conversion circuit ADC 5, from a test signal generator or the like and then, the control unit compares an output of each of the sub-A/D conversion circuit ADC 1 to 4 and an output of the reference A/D conversion circuit ADC 5 to generate a compensation control signal.

Each disclosure of the above-mentioned Patent Documents is incorporated herein by reference. Modifications and adjustments of the exemplary embodiments are possible within the scope of the overall disclosure (including claims) of the present invention, and based on the basic technical concept of the invention. Various combinations or selections of various disclosed elements are possible within the scope of the claims of the present invention. That is, the present invention of course includes various variations and modifications that could be made by those skilled in the art according to the overall disclosure including the claims and the technical concept.

What is claimed is:

1. An A/D conversion apparatus comprising:
   first to M-th (M being a preset integer not less than two) A/D conversion circuits connected in parallel, the first to M-th A/D conversion circuits converting an analog input signal to digital signals respectively in response to M-phase sampling signals which are obtained by frequency-dividing a clock signal by M and are equally spaced by one cycle of the clock signal;
   a reference A/D conversion circuit that converts the analog input signal to a digital signal, in response to a sampling signal obtained by frequency-dividing the clock signal by (n×M+1) (n being a preset positive integer), the first to M-th A/D conversion circuits and the reference A/D conversion circuit having analog inputs connected in common; and
   a control unit that compares, for each period of (n×M+1) cycles of the clock signal, one of the digital signals output from a corresponding one of the first to M-th A/D conversion circuits with the digital signal output from the reference A/D conversion circuit in a predetermined order of the first to M-th A/D conversion circuits, and generates a compensation control signal, based on a result of the comparison to supply the compensation control signal to the corresponding one of the A/D conversion circuits.

2. The A/D conversion apparatus according to claim 1, wherein the control unit comprises
   first to M-th control units, respectively corresponding to the first to M-th A/D conversion circuits.

3. The A/D conversion apparatus according to claim 2, wherein each of the first to M-th control units compares, for each period of M×(n×M+1) cycles of the clock signal, the digital signal output from one of the first to M-th A/D conversion circuits corresponding to the control unit with the digital signal output from the reference A/D conversion circuit in a period of (n×M+1) cycles of the clock signal.

4. The A/D conversion apparatus according to claim 1, wherein the control unit receives the first to M-th digital signals respectively output from the first to M-th A/D conversion circuits, in parallel.

5. The A/D conversion apparatus according to claim 1, wherein a time interval during which the control unit is enabled to compare the digital signal output from each of the first to M-th A/D conversion circuits with the digital signal output from the reference A/D conversion circuit is set to M cycles of the clock signal at maximum.

6. The A/D conversion circuit according to claim 1, comprising:
   a multiplexing circuit that cyclically switches, selects, and outputs, for each period of the clock signal, first to M-th digital signals at timings equally spaced by one cycle of the clock signal, the first to M-th digital signals being respectively output from the first to M-th A/D conversion circuits for each period of M cycles of the clock signal;
   the control unit comparing, for each period of (n×M+1) cycles of the clock signal, one of the digital signals cyclically and sequentially switched and output from the multiplexing circuit, for each period of the clock signal with the digital signal output from the reference A/D conversion circuit for each period of (n×M+1) cycles of the clock signal, the comparison being performed in a predetermined numbered cycle out of (n×M+1) cycles of the clock signal.

7. The A/D conversion apparatus according to claim 1, wherein the control unit generates the compensation control signal such that a difference between the digital signal output from each of the first to M-th A/D conversion circuits and the digital signal output from the reference A/D conversion circuit is minimized.

8. A compensation control method of an A/D conversion apparatus of an interleave system where first to M-th (M being a preset integer not less than two) A/D conversion circuits connected in parallel respectively convert an analog input signal to digital signals in response to M-phase sampling signals which are obtained by frequency-dividing a clock signal by M and are equally spaced by one cycle of the clock signal, the method comprising:
   providing a reference A/D conversion circuit having an analog input connected in common with analog inputs of the first to M-th A/D conversion circuits;
   the reference A/D conversion circuit converting the analog input signal to a digital signal, in response to a sampling signal obtained by frequency-dividing the clock signal by (n×M+1) (n being a preset positive integer); and
   a control unit comparing, for each period of (n×M+1) cycles of the clock signal, one of the digital signals from a corresponding one of the first to M-th A/D conversion circuits with the digital signal from the reference A/D conversion circuit in a predetermined order of the first to M-th A/D conversion circuits, generating a compensation control signal based on a result of the comparison, and supplying the compensation control signal to the corresponding one of the A/D conversion circuits.

9. The compensation control method of an A/D conversion apparatus according to claim 8, wherein the control unit comprises first to M-th control units respectively corresponding to the first to M-th A/D conversion circuits.

10. The compensation control method of an A/D conversion apparatus according to claim 9, comprising each of the first to M-th control units comparing, for each period of (n×M+1) cycles of the clock signal, the digital signal output from one of the first to M-th A/D conversion circuits corresponding to the control unit with the digital signal output from the reference A/D conversion circuit, for each period of M×(n×M+1) cycles of the clock signal.

11. The compensation control method of an A/D conversion apparatus according to claim 8, comprising the control unit receives first to M-th digital signals respectively output from the first to M-th A/D conversion circuits, in parallel.

12. The compensation control method of an A/D conversion apparatus according to claim 8, wherein a time interval during which the control unit is enabled to compare the digital signal output from each of the first to M-th A/D conversion circuits with the digital signal output from the reference A/D conversion circuit is set to M cycles of the clock signal at maximum.

13. The compensation control method of an A/D conversion apparatus according to claim 8, comprising:

cyclically switching, selecting, and multiplexing each of first to M-th digital signals at one of timings separated by intervals each corresponding to one cycle of the clock signal, for each period of the clock signal, by a multiplexing circuit, the first to M-th digital signals being respectively output from the first to M-th A/D conversion circuits for each period of M cycles of the clock signal; and the control unit comparing one of the digital signals cyclically and sequentially switched and then output from the multiplexing circuit for each period of the clock signal with the digital signal output from the reference A/D conversion circuit for each period of (n×M+1) cycles of the clock signal, for each period of (n×M+1) cycles of the clock signal, the comparison being performed in a predetermined numbered one of (n×M+1) cycles of the clock signal.

14. The compensation control method of an A/D conversion apparatus according to claim 8, comprising the control unit generating the compensation control signal such that a difference between the digital signal output from each of the first to M-th A/D conversion circuits and the digital signal output from the reference A/D conversion circuit is minimized.

* * * * *